United States Patent
Dai et al.

(10) Patent No.: US 9,991,361 B2
(45) Date of Patent: Jun. 5, 2018

(54) METHODS FOR PERFORMING A GATE CUT LAST SCHEME FOR FINFET SEMICONDUCTOR DEVICES

(71) Applicant: GLOBALFOUNDRIES Inc., Grand Cayman (KY)

(72) Inventors: Xintuo Dai, Rexford, NY (US); Haigou Huang, Rexford, NY (US); Xusheng Wu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 12 days.

(21) Appl. No.: 15/165,294

(22) Filed: May 26, 2016

(65) Prior Publication Data

US 2017/0345913 A1    Nov. 30, 2017

(51) Int. Cl.
H01L 21/8238    (2006.01)
H01L 29/66    (2006.01)
H01L 29/78    (2006.01)

(52) U.S. Cl.
CPC .... H01L 29/66545 (2013.01); H01L 29/7851 (2013.01)

(58) Field of Classification Search
CPC .............................................. H01L 21/823821
See application file for complete search history.

(56) References Cited

U.S. PATENT DOCUMENTS

2011/0156107 A1* 6/2011 Bohr ................. H01L 21/76831
257/288
2014/0220767 A1* 8/2014 Hu ..................... H01L 29/66545
438/585
2016/0133632 A1* 5/2016 Park .................. H01L 21/82382
257/369

* cited by examiner

Primary Examiner — Peniel M Gumedzoe
Assistant Examiner — Christopher Johnson
(74) Attorney, Agent, or Firm — Amerson Law Firm, PLLC (57) ABSTRACT

A method includes forming a placeholder gate structure embedded in a dielectric layer. The placeholder gate structure includes a sacrificial material. A first hard mask layer is formed above the dielectric layer. The first hard mask layer and the sacrificial material are the same material. A second hard mask layer is formed above the first hard mask layer. The second hard mask layer is patterned to define an opening therein exposing a portion of the first hard mask layer and being disposed above a portion of the placeholder gate structure. The exposed portion of the first hard mask layer and the portion of the sacrificial material of the placeholder gate structure disposed below the opening are removed to define a gate cut cavity and divide the placeholder gate structure into first and second segments. A dielectric material is formed in the gate cut cavity.

20 Claims, 13 Drawing Sheets

METHODS FOR PERFORMING A GATE CUT LAST SCHEME FOR FINFET SEMICONDUCTOR DEVICES

BACKGROUND OF THE INVENTION

1. Field of the Invention

The present disclosure generally relates to the fabrication of integrated circuits, and, more particularly, to various methods of performing gate cut etch processes for FinFET semiconductor devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

Figure 1A:
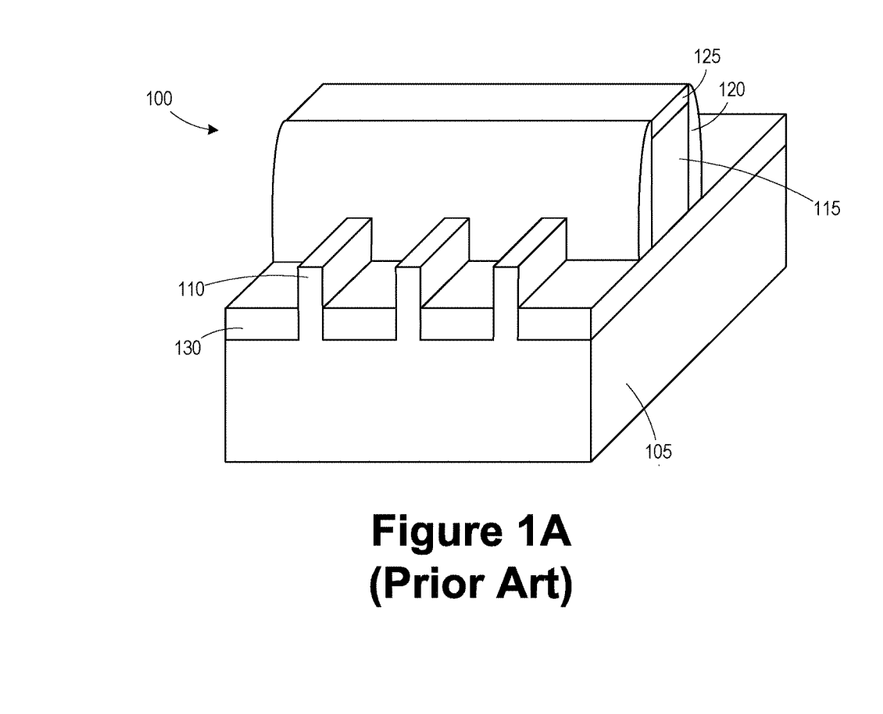
FIGS. 1A-1D are views of one illustrative embodiment of a prior art semiconductor product illustrating erosion in a CT cut process.

In some applications, fins for FinFET devices are formed such that the fin is vertically spaced apart from and above the substrate with an isolation material positioned between the fin and the substrate. FIG. 1A is a perspective view of an illustrative prior art FinFET semiconductor device 100 that is formed above a semiconductor substrate 105 at an intermediate point during fabrication. In this example, the FinFET device 100 includes three illustrative fins 110, an isolation material 130 (e.g., silicon dioxide, a low-k material or an ultra-low-k material), a gate structure 115, sidewall spacers 120 (e.g., silicon nitride) and a gate cap layer 125 (e.g., silicon nitride). The fins 110 have a three-dimensional configuration: a height, a width, and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

Typically, fins are formed in a regular array. To define separate transistor devices, the length of the fins may be adjusted and some fins or portions of fins may be removed. For example, a fin cut or "FC cut" process cuts fins in the cross direction. Typically, an array of gate structures is formed above the remaining fin portion after the FC process. Subsequently a gate cut or "CT cut" process is performed to cut the gate structures in the cross direction. Each cut process requires a separate multilayer patterning stack and lithography processes, complicating the process flow and increasing the fabrication time of the semiconductor devices.

Figure 1B:
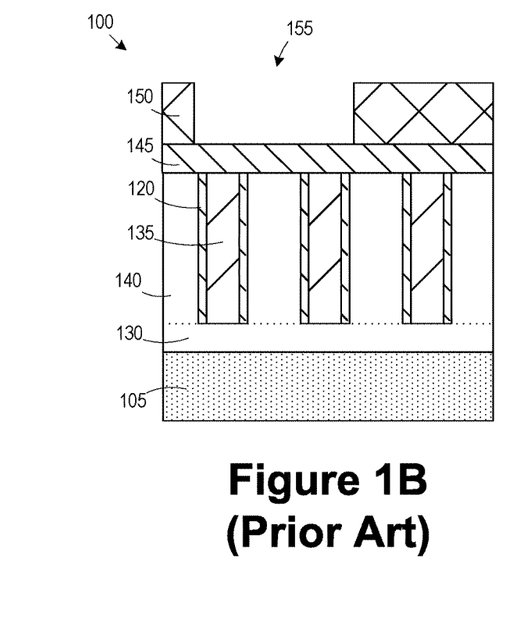

FIG. 1B illustrates cross-section views of the product 100 at a previous point in the process flow to illustrate a CT cut process. A placeholder gate structure 135 (e.g., a silicon dioxide gate dielectric layer and an amorphous silicon sacrificial material) was formed above the fins 110. A dielectric layer 140 was formed above the placeholder gate structure 135 and planarized to expose the placeholder gate structure 135. A replacement gate technique is employed at a later stage in the process flow to replace the placeholder gate structure 135 with a metal gate structure to allow work function tailoring. A hard mask layer 145 (e.g., silicon nitride) was formed above the dielectric layer 140, and a patterning layer 150 was formed above the hard mask layer 145. The patterning layer 150 may include a stack of layers such as a spin-on hard mask (SOH) layer, an oxide layer, a bottom anti-reflective coating (BARC) layer, a photoresist layer, etc. (not separately illustrated) that were patterned to define an opening 155 above the hard mask layer 145. In general, the opening 155 is a CT opening used to cut the gate structure 135.

Figure 1C:
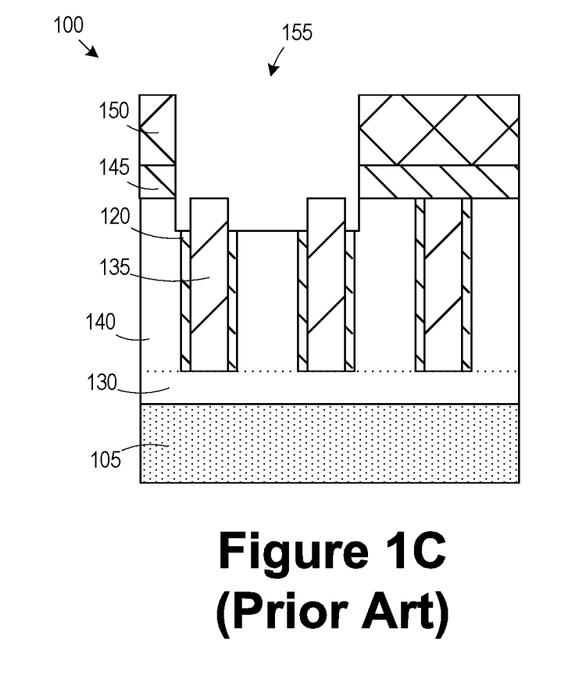

FIG. 1C illustrates the product 100 after an etch process was performed in the presence of the patterning layer 150 to define a corresponding opening in the hard mask layer 145. Since the spacers 120 and the hard mask layer 145 may be both formed of silicon nitride, the etch process may erode the spacers 120. Also, since nitride-oxide selectivity is imperfect, especially for small features, portions of the dielectric layer 140 may also be eroded.

Figure 1D:
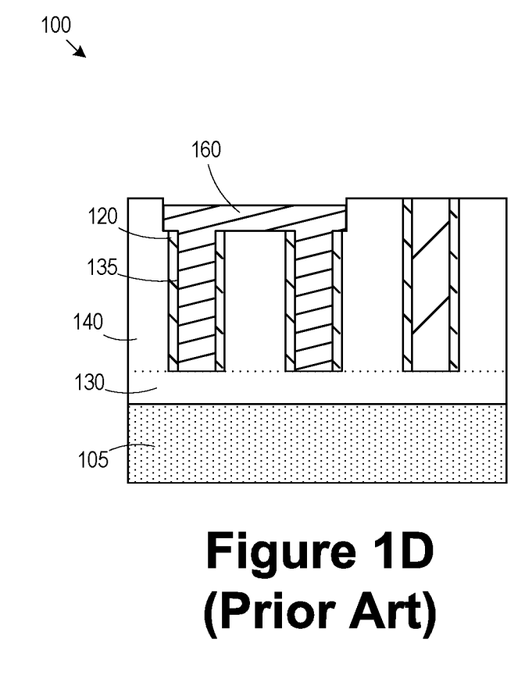

FIG. 1D illustrates the product 100 after a plurality of processes was performed to remove the patterning layer 150, remove the exposed portions of the placeholder gate structures 135, remove the hard mask layer 145, and fill the resulting recesses with an insulating material 160 (e.g., silicon nitride) to complete the CT process.

At later stages in the process flow, the remaining placeholder gate structures 135 are replaced and a self-aligned contact (SAC) etch process may be employed to define contacts between the replacement gate structures (not shown). The erosion of the spacers 120 and the dielectric layer 140 reduces the margin for the SAC process and increase the likelihood of a contact-to-contact short in the tip-to-tip region where the CT process was performed.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of performing a gate cut ("CT cut") last scheme for FinFET semiconductor devices. One illustrative method includes, among other things, forming a placeholder gate structure embedded in a dielectric layer. The placeholder gate structure includes a sacrificial material. A first hard mask layer is formed above the dielectric layer. The first hard mask layer and the sacrificial material are the same material. A second mask layer is formed above the first hard mask layer. The second mask layer is patterned to define an opening therein exposing a portion of the first hard mask layer and being disposed above a portion of the placeholder gate structure. The exposed portion of the first hard mask layer and the portion of the sacrificial material of the placeholder gate structure disposed below the opening are removed to define a gate cut cavity and divide the placeholder gate structure into first and second segments. A dielectric material is formed in the gate cut cavity.

Another illustrative method includes, among other things, forming a plurality of placeholder gate structures embedded in a dielectric layer. Each of the plurality of placeholder gate structures includes a sacrificial material. A first hard mask layer is formed above the dielectric layer. The first hard mask layer and the sacrificial material are the same material. A second mask layer is formed above the first hard mask layer. The second mask layer is patterned to define an opening therein exposing a portion of the first hard mask layer and being disposed above portions of a subset of the plurality of placeholder gate structures. The exposed portion of the first hard mask layer and the portions of the sacrificial material of the subset of the plurality of placeholder gate structures disposed below the opening are removed to define a gate cut cavity in each of the plurality of placeholder gate structures in the subset. A dielectric material is formed in the gate cut cavity. The second hard mask layer is removed. Remaining portions of the first hard mask layer and remaining portions of the sacrificial material of the plurality of placeholder gate structures are removed to define a plurality of gate cavities. A conductive material in the plurality of gate cavities is formed to define a plurality of replacement gate structures.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of performing a gate cut last scheme for FinFET semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The inventions disclosed herein should not be considered to be limited to the illustrative examples depicted and described herein. With reference to the attached figures, various illustrative embodiments of the methods and devices disclosed herein will now be described in more detail.

FIGS. 2A-2K depict one illustrative method disclosed for performing a gate cut last scheme for FinFET semiconductor devices on a semiconductor substrate 205. The illustrative product 200 includes a plurality of fins 210 formed in the semiconductor substrate 205. The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon germanium or it may be made of materials other than silicon, such as germanium. Thus, the terms "substrate" or "semiconductor substrate" should be understood to cover all semiconducting materials and all forms of such materials. The substrate 205 may have different layers.

Figure 2A:
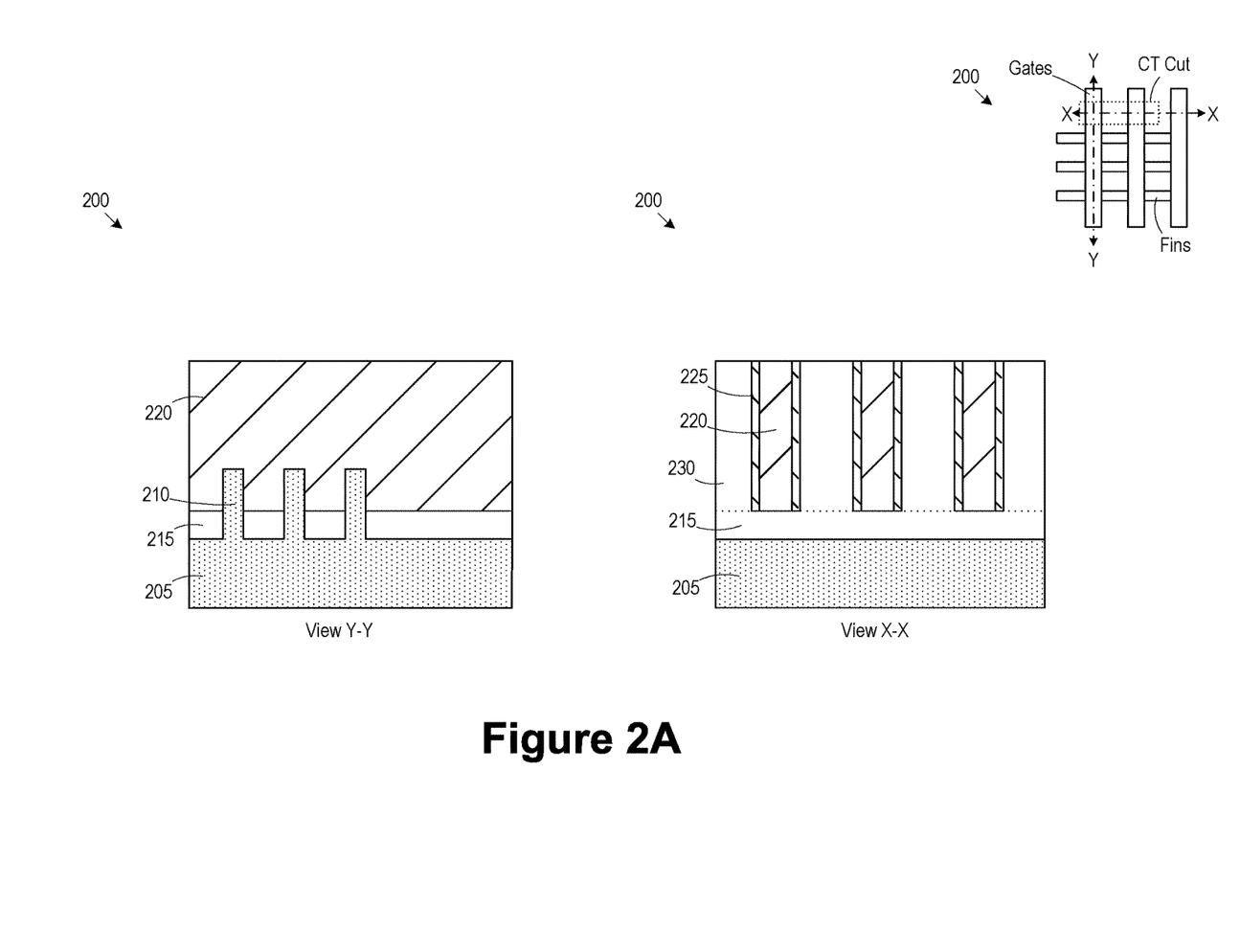
FIGS. 2A-2K depict one illustrative method disclosed for performing a gate cut last scheme for FinFET semiconductor devices.

FIG. 2A depicts the product 200 at a point in fabrication wherein several process operations have been performed. First, the plurality of fins 210 were formed by etching trenches in the substrate 205. In general, the fins 210 define an active region for forming devices, such as FinFET transistors. The illustrative product 200 disclosed herein is depicted as being comprised of three illustrative fins 210.

However, as will be recognized by those skilled in the art after a complete reading of the present application, the methods and devices disclosed herein may be employed when manufacturing devices having any number of fins 210. A dielectric layer 215 (e.g., silicon dioxide, a low-k dielectric material, etc.) was then formed in the trenches defined between the fins 210 to serve as an isolation structure. Subsequently, placeholder gate structures 220 were formed above the portions of the fins 210 exposed by the dielectric layer 215. The placeholder gate structures 220 represent replacement or sacrificial gate structures and may include multiple layers (not separately shown), such as a gate insulation layer (e.g., silicon dioxide) and a sacrificial gate electrode material (e.g., amorphous silicon). Spacers 225 were formed on the gate structures 220. A dielectric layer 230 (e.g., silicon dioxide, a low-k dielectric material or an ultra-low-k material, etc.) was formed above the fins 210 and placeholder gate structures 220 and a planarization process was performed to expose the top surfaces of the placeholder gate structures 220.

FIGS. 2A-2K also include a simplistic plan view of the product 200 (in the upper right corner of each sheet) that depicts the location where various cross-sectional views depicted in the following drawings will be taken. More specifically, the cross-sectional view "X-X" is taken along the long axis of a placeholder gate structure 220 spanning the fins 210 and the cross-sectional view "Y-Y" is taken in a direction perpendicular to the placeholder gate structures 220 and parallel to a long axis of a fin 210 in a region that is to be cut using a CT cut process. Not all of the features illustrated in the views "X-X" and "Y-Y" are replicated in the simplistic plan view.

Figure 2B:
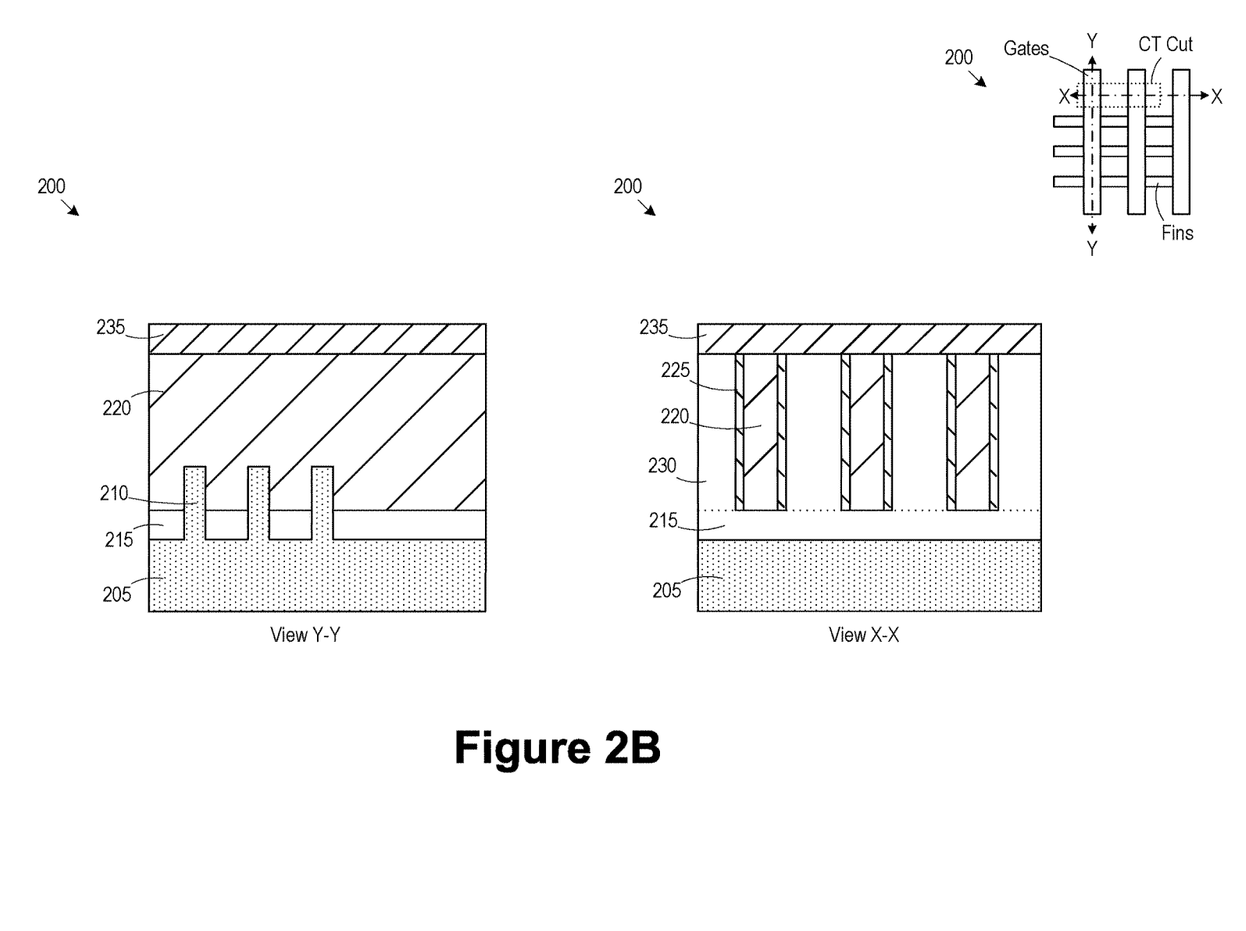

FIG. 2B illustrates the product 200 after a deposition process was performed to deposit a first hard mask layer 235 above the dielectric layer 230. In the illustrated embodiment, the first hard mask layer 235 is the same material as the sacrificial gate electrode material of the placeholder gate structures 220, e.g., amorphous silicon.

Figure 2C:
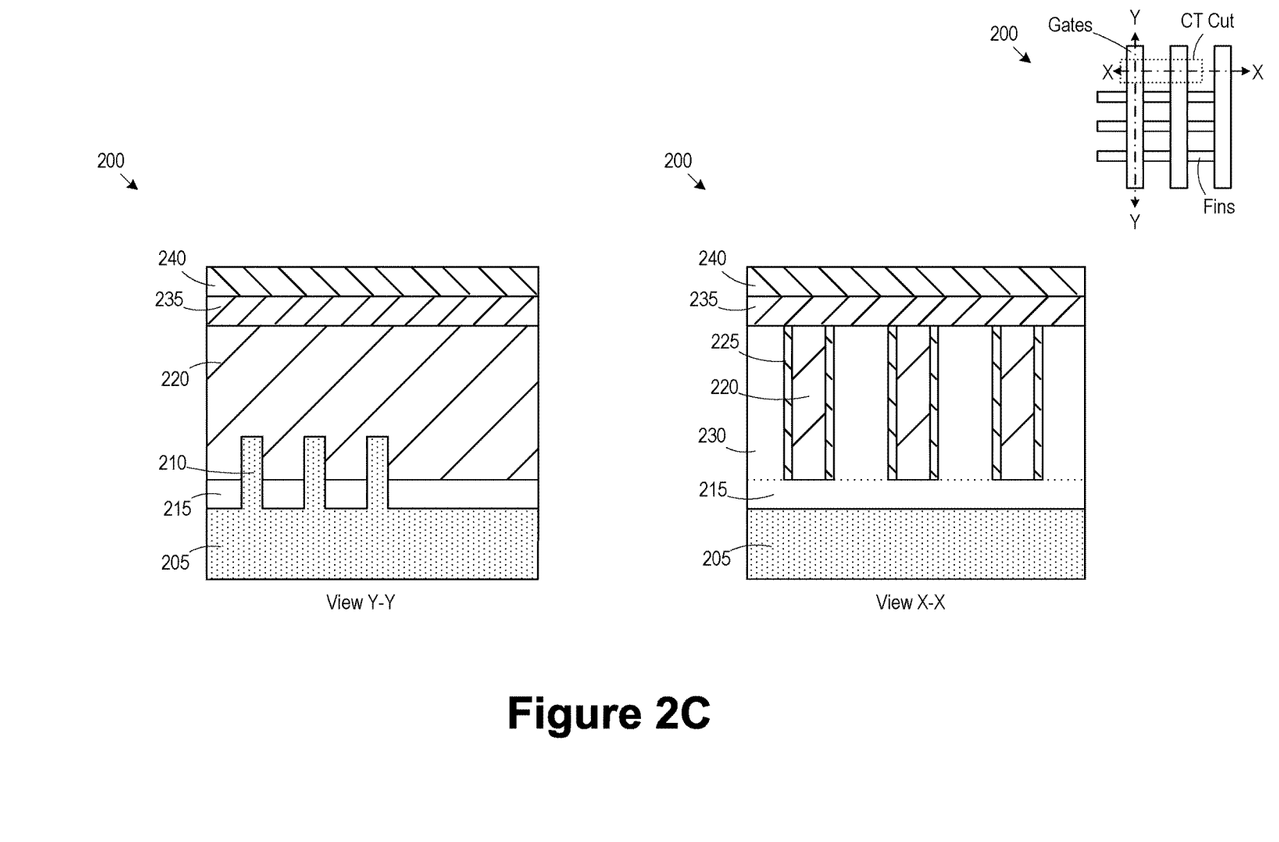

FIG. 2C illustrates the product 200 after a deposition process was performed to form a second hard mask layer 240 (e.g., silicon nitride) above the first hard mask layer 235. In general, the materials of the first hard mask layer 235 and the second hard mask layer 240 provide etch selectivity therebetween.

Figure 2D:
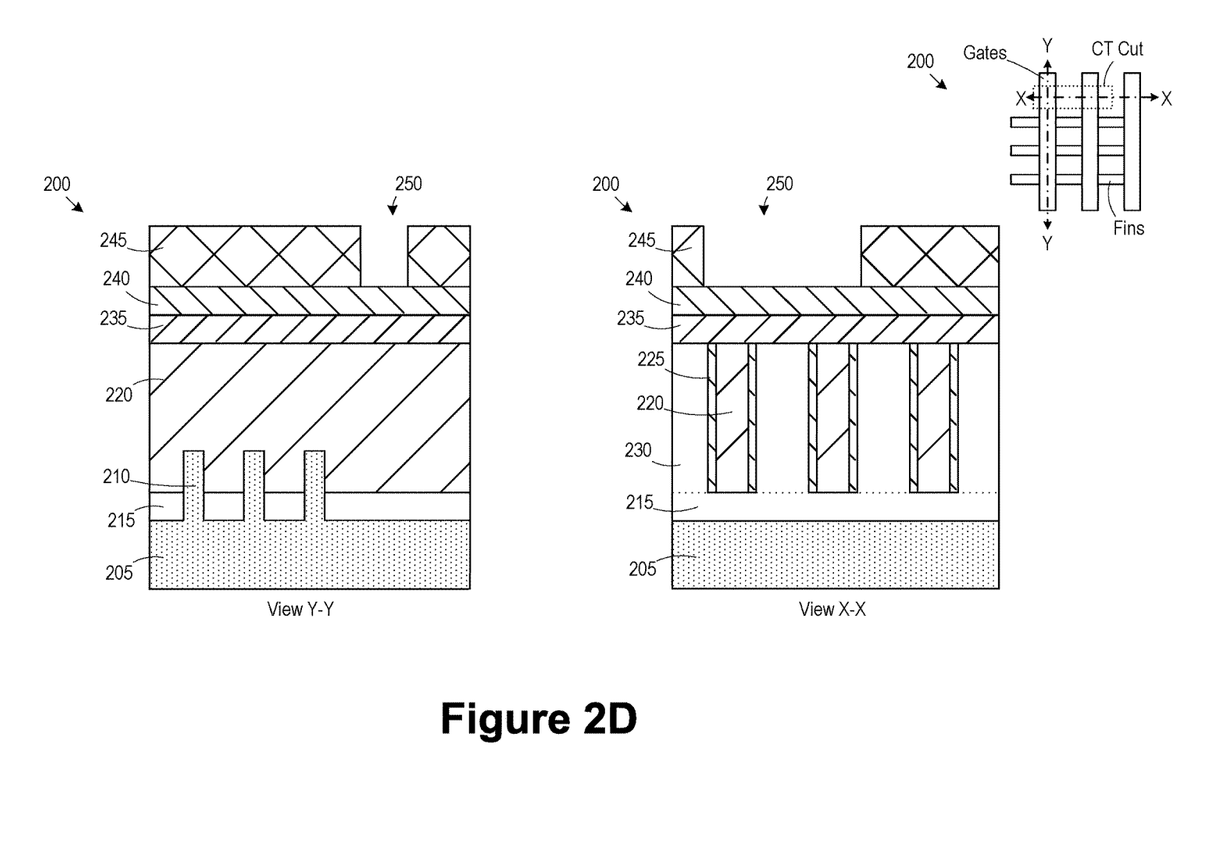

FIG. 2D illustrates the product 200 after a plurality of processes was performed to form a patterning layer 245 with an opening 250 defined therein corresponding to a desired CT cut region. In the illustrated embodiment, the patterning layer 245 was formed using a photolithography stack, including, for example, an organic planarization (OPL) layer, an anti-reflective coating (ARC) layer, and a photoresist layer. The ARC layer was formed above the OPL layer, and the photoresist was formed above the ARC layer. The photoresist layer was exposed to radiation using a reticle and developed to generate a pattern. The photoresist pattern was transferred to the ARC and OPL layers, and the photoresist and ARC layers were removed. Thus, the patterning layer 245 may be the remaining OPL layer.

Figure 2E:
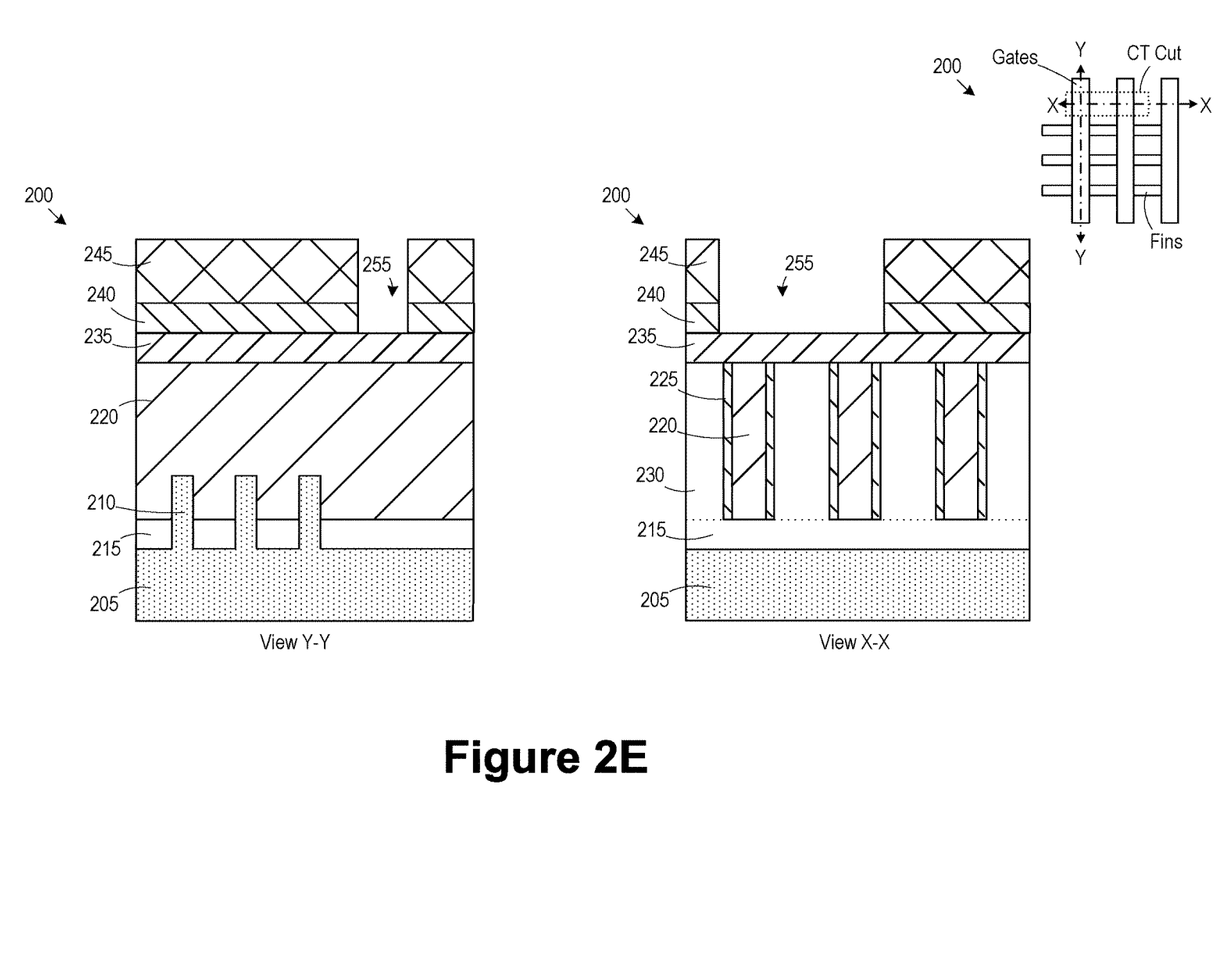

FIG. 2E illustrates the product 200 after a selective etch process was performed to define a CT opening 255 in the second hard mask layer 240. The selective etch process is selective to the material of the first hard mask layer 235.

Figure 2F:
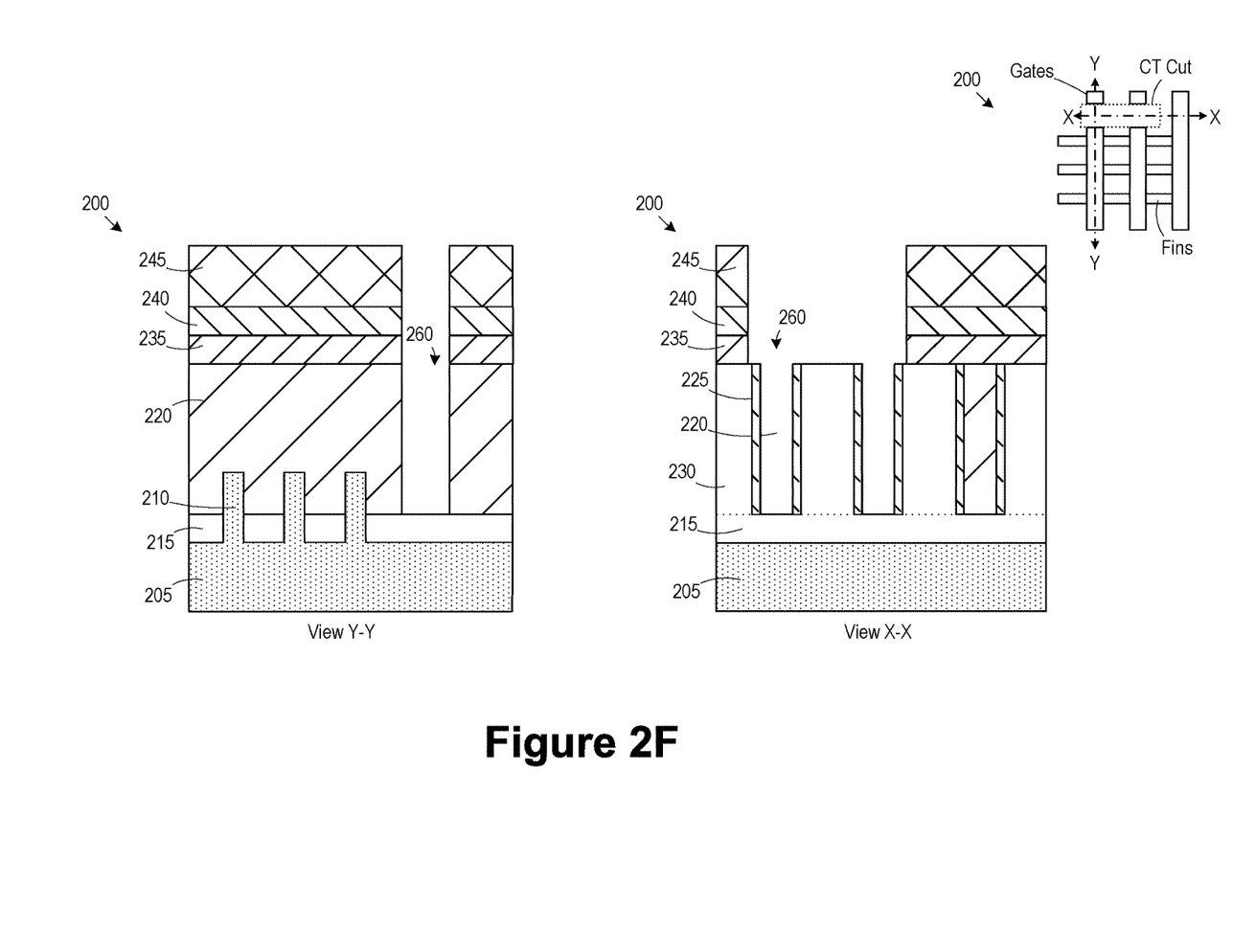

FIG. 2F illustrates the product 200 after a selective reactive ion etch (RIE) process was performed to concurrently remove the portions of the first hard mask layer 235 and the placeholder gate structures 220 exposed by the CT opening 255 to define a CT recess 260 in the placeholder gate structures 220. Since the first hard mask layer 235 and the placeholder gate structures 220 are made of the same material, which exhibits high selectivity to the material of the spacers 225 and the dielectric layer 230, the erosion described above in reference to FIG. 1C is avoided.

Figure 2G:
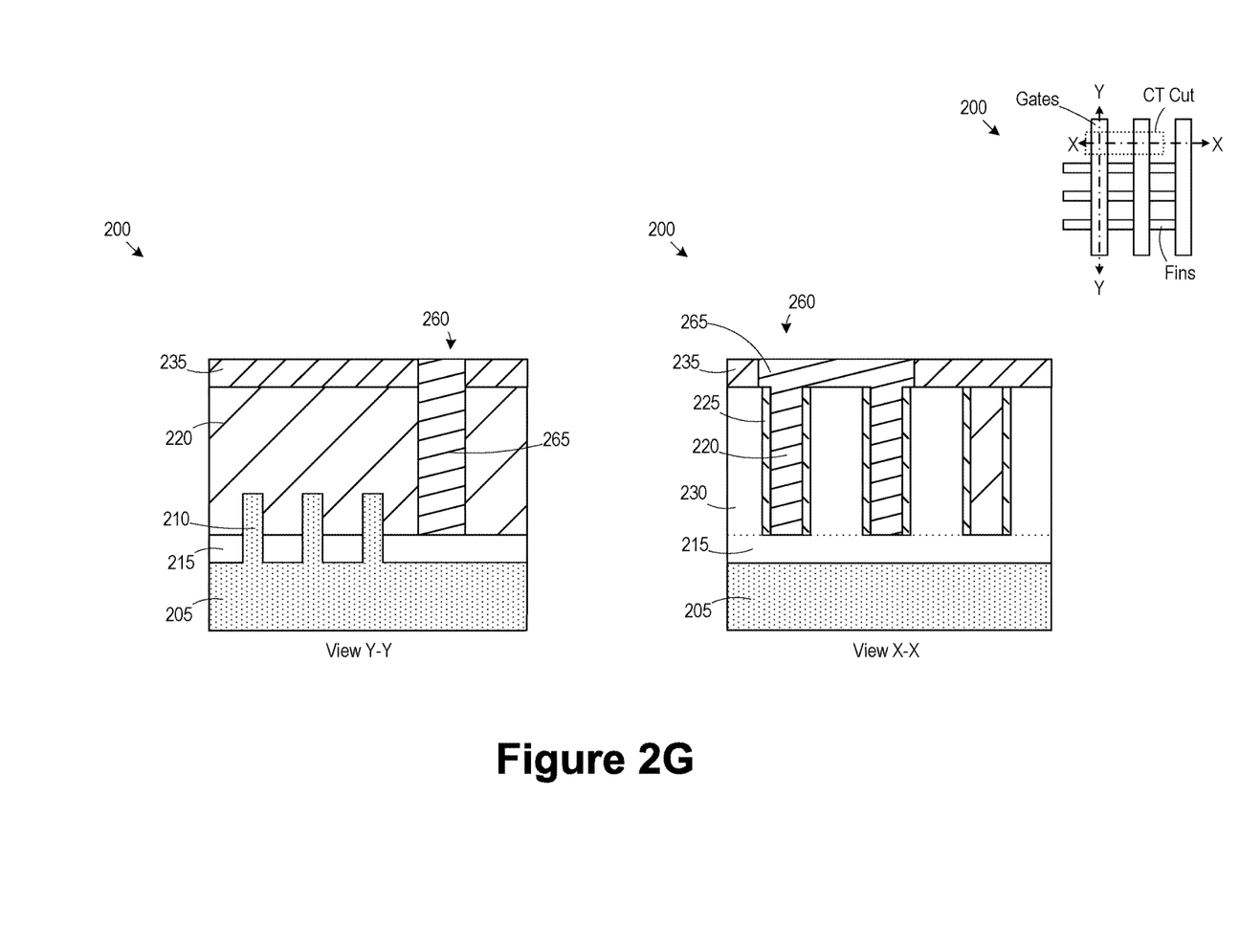

FIG. 2G illustrates the product 200 after a plurality of processes was performed. One or more etch processes were performed to remove the patterning layer 245 and the second hard mask layer 240. A deposition process was performed to form an insulating material 265 (e.g., silicon nitride) in the CT recess 260, and a planarization process was performed to remove portions of the insulating material 265 extending outside the CT recess 260 and above the first hard mask layer 235.

Figure 2H:
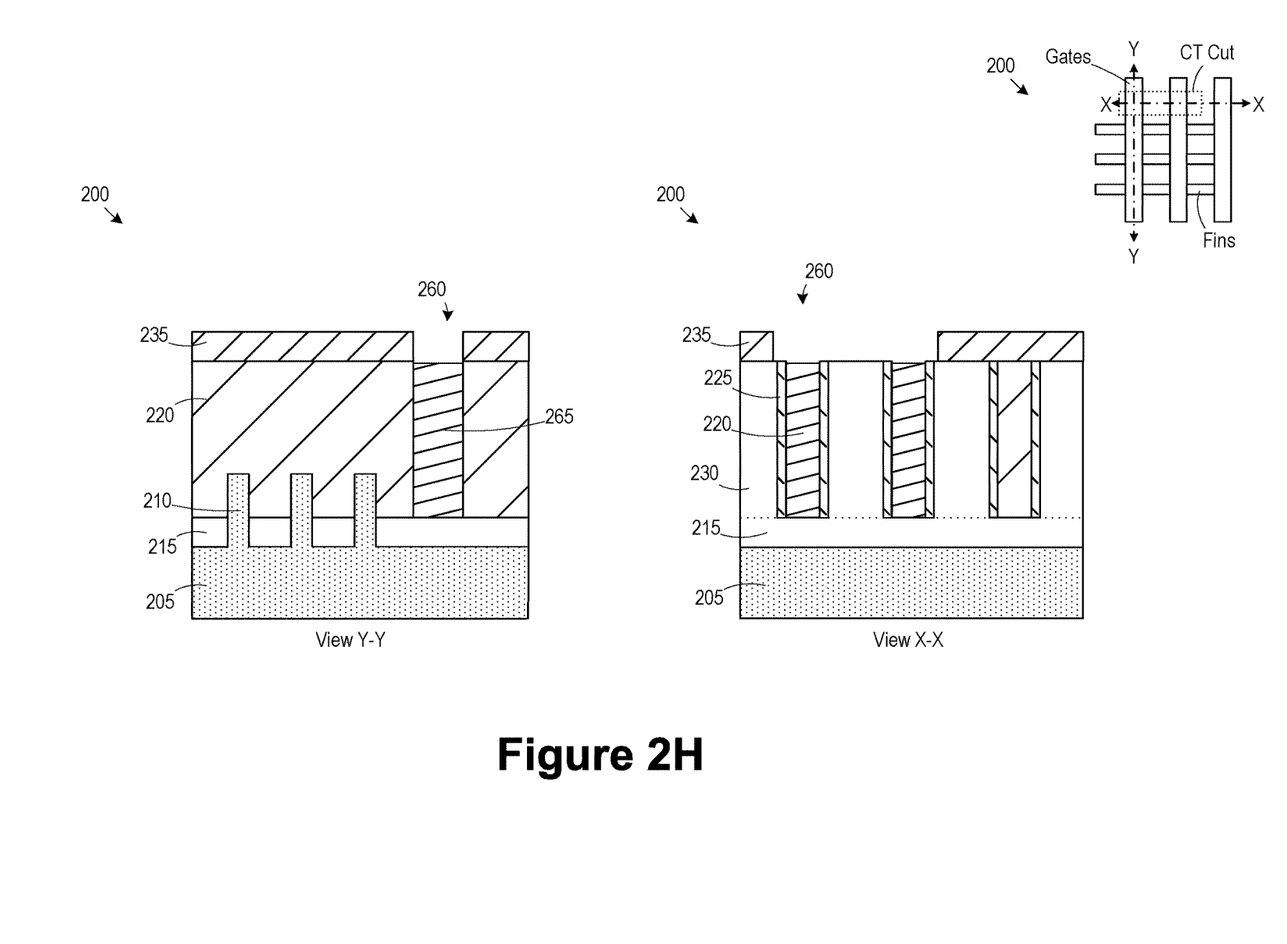

FIG. 2H illustrates the product 200 after a selective timed etch process was performed to recess the insulating material 265 to a level substantially even with the dielectric layer 230.

Figure 2I:
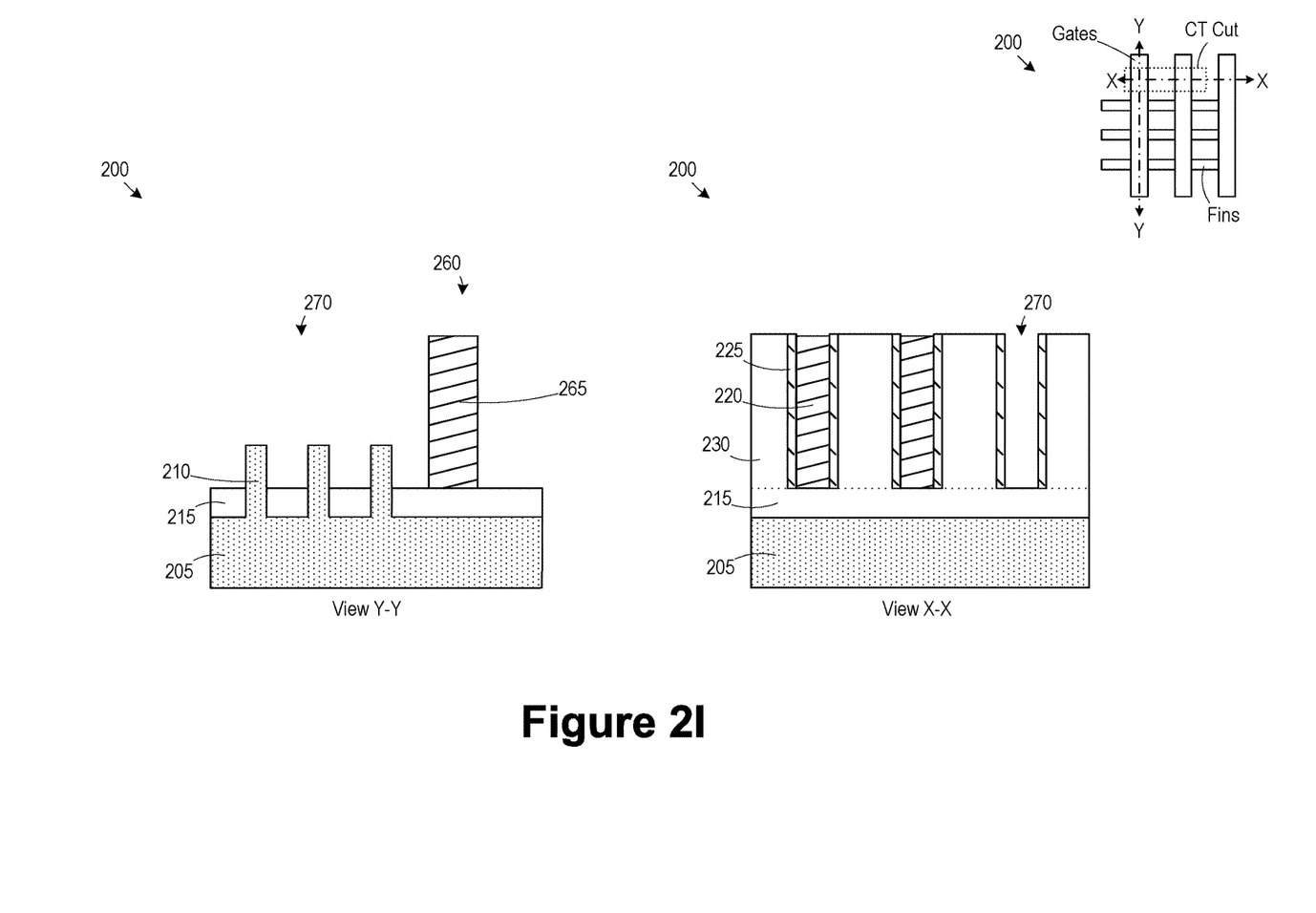

FIG. 2I illustrates the product 200 after a selective reactive ion etch (RIE) process was performed to remove the remaining portions of the first hard mask layer 235 and the remaining placeholder gate structures 220 to define a gate recess 270. Again, since the first hard mask layer 235 and the placeholder gate structures 220 are made of the same material, a common etch process may be used to remove them concurrently.

Figure 2J:
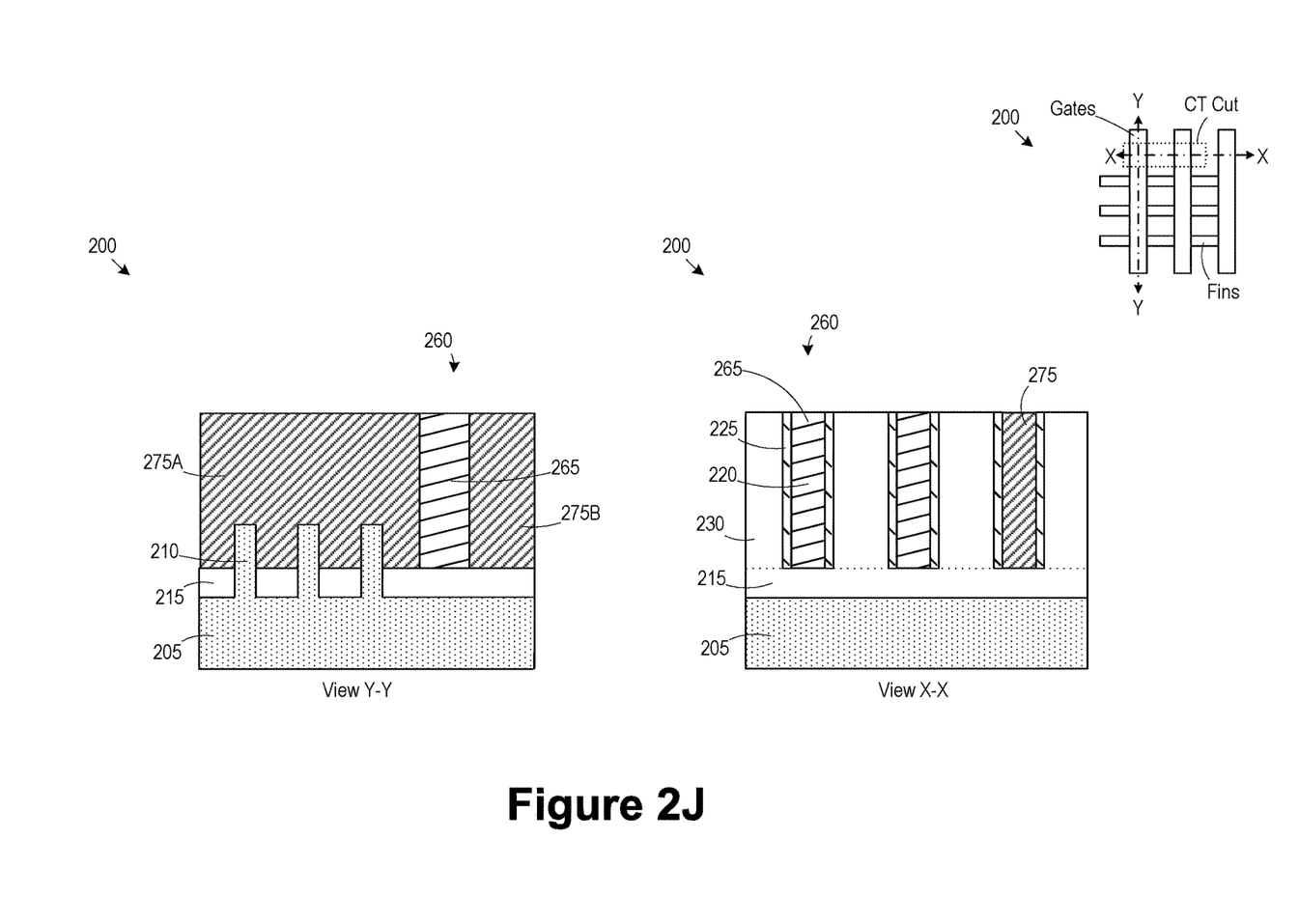

FIG. 2J illustrates the product 200 after a plurality of processes was performed to form replacement gate structures 275. The replacement gate structures 275 subjected to the CT cut process include a first segment 275A aligned with a second segment 275B. The processes may include one or more deposition processes to form a gate insulation layer (e.g., silicon dioxide, hafnium oxide or a high-k material) and one or more conductive layers (e.g., barrier layers, seed layers, work function material layers, fill layers) that will be part of a gate electrode of the replacement gate structure 275 (layers not separately shown). The conductive layers may be planarized.

Figure 2K:
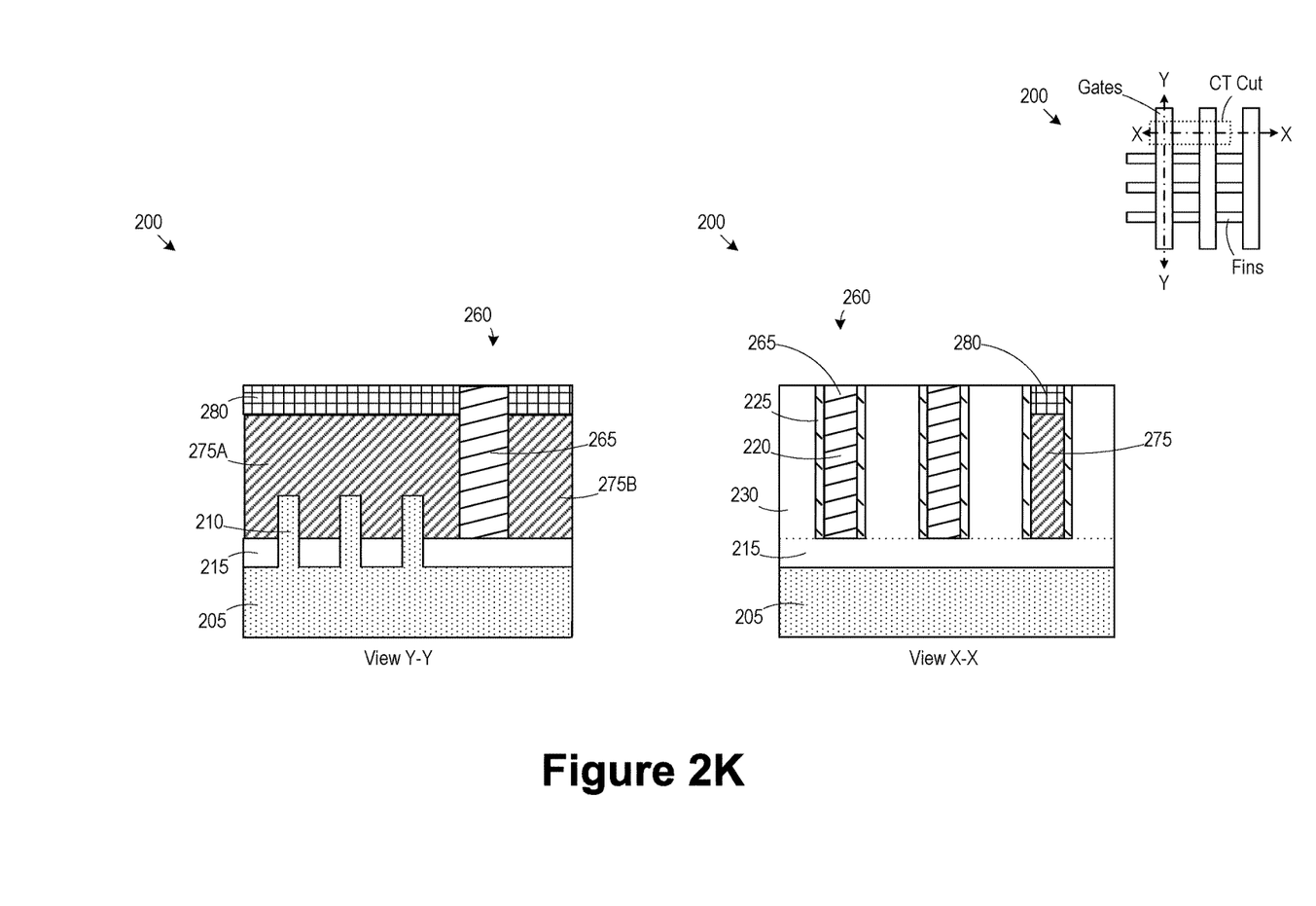

FIG. 2K illustrates the product 200 after a plurality of processes was performed. An etch process was performed to recess the replacement gate structure 275, and a cap layer 280 (e.g., silicon nitride) was formed in the recess.

Additional process steps may be formed to complete fabrication of the device 200, such as the forming of metallization layers including interconnects for contacting the various portions of the device 200, such as the source/drain regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
forming a placeholder gate structure embedded in a dielectric layer, said placeholder gate structure including a sacrificial material;
forming a first hard mask layer above said dielectric layer, said first hard mask layer and said sacrificial material comprising a same material;
forming a second hard mask layer above said first hard mask layer;
patterning said second hard mask layer to define an opening therein exposing a portion of said first hard mask layer and being disposed above a portion of said placeholder gate structure;
removing said exposed portion of said first hard mask layer and a portion of said sacrificial material of said placeholder gate structure disposed below said opening to define a gate cut cavity and divide said placeholder gate structure into first and second segments, wherein said exposed portion of said first hard mask layer and said portions of said sacrificial material of said placeholder gate structure disposed below said opening to define said gate cut cavity are removed using a concurrent etch process; and
forming a dielectric material in said gate cut cavity.

2. The method of claim 1, further comprising:
removing said second hard mask layer;
after forming said dielectric material in said gate cut cavity, removing remaining portions of said first hard mask layer and remaining portions of said sacrificial material of said placeholder gate structure to define a gate cavity; and
forming a conductive material in said gate cavity to define a replacement gate structure.

3. The method of claim 2, further comprising:
recessing said conductive material to define a gate cap recess; and
forming a cap layer in said gate cap recess.

4. The method of claim 1, wherein said first hard mask layer and said sacrificial material comprise amorphous silicon.

5. The method of claim 4, wherein said second hard mask layer comprises silicon nitride.

6. The method of claim 1, further comprising removing said second hard mask layer prior to forming said dielectric material in said gate cut cavity.

7. The method of claim 6, wherein forming said dielectric material in said gate cut cavity comprises:
forming said dielectric material above said first hard mask layer and in said gate cut cavity; and
removing portions of said dielectric material extending above said first hard mask layer.

8. The method of claim 7, further comprising recessing said dielectric material to a level substantially equal to a top surface of said dielectric layer.

9. The method of claim 7, further comprising:
removing remaining portions of said first hard mask layer and remaining portions of said sacrificial material of said placeholder gate structure to define a gate cavity; and
forming a conductive material in said gate cavity and above said dielectric layer.

10. The method of claim 9, further comprising:
recessing said conductive material to define a gate cap recess; and
forming a cap layer in said gate cap recess.

11. A method, comprising:
forming a plurality of placeholder gate structures embedded in a dielectric layer, each of said plurality of placeholder gate structures including a sacrificial material;
forming a first hard mask layer above said dielectric layer, said first hard mask layer and said sacrificial material comprising a same material;
forming a second mask layer above said first hard mask layer;
patterning said second hard mask layer to define an opening therein exposing a portion of said first hard mask layer and being disposed above portions of a subset of said plurality of placeholder gate structures;
removing said exposed portion of said first hard mask layer and portions of said sacrificial material of said subset of said plurality of placeholder gate structures disposed below said opening to define a gate cut cavity in each of said plurality of placeholder gate structures in said subset, wherein said exposed portion of said first hard mask layer and said portions of said sacrificial material of said placeholder gate structure disposed below said opening to define said gate cut cavity are removed using a concurrent etch process;
forming a dielectric material in said gate cut cavity;
removing said second hard mask layer;
removing remaining portions of said first hard mask layer and remaining portions of said sacrificial material of said plurality of placeholder gate structures to define a plurality of gate cavities; and
forming a conductive material in said plurality of gate cavities to define a plurality of replacement gate structures.

12. The method of claim 11, wherein said dielectric material disposed in said gate cut cavities divides said plurality of replacement gate structures in said subset into aligned segments.

13. The method of claim 12, further comprising:
recessing said conductive material to define gate cap recesses; and
forming a cap layer in said gate cap recesses.

14. The method of claim 11, wherein said first hard mask layer and said sacrificial material comprise amorphous silicon.

15. The method of claim 14, wherein said second hard mask layer comprises silicon nitride.

16. The method of claim 11, wherein forming said dielectric material in said gate cut cavity comprises:
forming said dielectric material above said first hard mask layer and in said gate cut cavity; and
removing portions of said dielectric material extending above said first hard mask layer to a level substantially equal to a top surface of said dielectric layer.

17. The method of claim 11, wherein forming said conductive material in said plurality of gate cavities comprises:
after forming a dielectric material in said gate cut cavity, forming a conductive material in said gate cavities and above said dielectric layer; and
performing a planarizing process to remove portions of said conductive material disposed above said dielectric layer.

18. The method of claim 17, further comprising:
recessing said conductive material to define a gate cap recess; and
forming a cap layer in said gate cap recess.

19. A method, comprising:

forming a placeholder gate structure embedded in a dielectric layer, said placeholder gate structure including a sacrificial material;

forming a first hard mask layer above said dielectric layer, said first hard mask layer and said sacrificial material comprising a same material;

forming a second hard mask layer above said first hard mask layer;

patterning said second hard mask layer to define an opening therein exposing a portion of said first hard mask layer and being disposed above a portion of said placeholder gate structure;

removing said exposed portion of said first hard mask layer and a portion of said sacrificial material of said placeholder gate structure disposed below said opening to define a gate cut cavity and divide said placeholder gate structure into first and second segments;

removing said second hard mask layer; and after removing said second hard mask layer, forming a dielectric material above said first hard mask layer and in said gate cut cavity, removing portions of said dielectric material extending above said first hard mask layer, and recessing said dielectric material to a level substantially equal to a top surface of said dielectric layer.

20. The method of claim 19, further comprising:

after recessing said dielectric material, removing remaining portions of said first hard mask layer and remaining portions of said sacrificial material of said placeholder gate structure to define a gate cavity; and forming a conductive material in said gate cavity to define a replacement gate structure.

* * * * *